United States Patent
Gierth

(10) Patent No.: US 10,955,101 B2
(45) Date of Patent: Mar. 23, 2021

(54) LIGHTING DEVICE COMPRISING SEPARATOR SHEET

(71) Applicant: Lumileds Holding B.V., Schiphol (NL)

(72) Inventor: Rainald Gierth, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/719,073

(22) Filed: Dec. 18, 2019

(65) Prior Publication Data
US 2020/0200350 A1    Jun. 25, 2020

(30) Foreign Application Priority Data

Dec. 19, 2018    (EP) .................................... 18213876

(51) Int. Cl.
*B60Q 1/00* (2006.01)
*F21S 41/24* (2018.01)
*F21S 41/143* (2018.01)

(52) U.S. Cl.
CPC ............ *F21S 41/24* (2018.01); *F21S 41/143* (2018.01)

(58) Field of Classification Search
CPC ............................... F21S 41/24; F21S 41/143
USPC ........................................................ 362/487
See application file for complete search history.

(56) References Cited

U.S. PATENT DOCUMENTS

| 2007/0257270 | A1* | 11/2007 | Lu ...................... G02B 19/0061 257/98 |
| 2015/0124469 | A1* | 5/2015 | Krenn .................. G02B 6/0008 362/511 |
| 2016/0139328 | A1* | 5/2016 | Hikmet ................ G02B 6/0031 362/84 |

FOREIGN PATENT DOCUMENTS

| WO | 2007026292 A1 | 3/2007 |
| WO | 2013107445 A1 | 7/2013 |

OTHER PUBLICATIONS

EP Application No. 18213876.8, "Extended EP Search Report and Written Opinion," dated Jun. 11, 2019, 7 pages.

(Continued)

*Primary Examiner* — Ali Alavi

(57) ABSTRACT

The disclosure relates to a lighting device. The object to provide a lighting device comprising a light guide, wherein the amount of guided light is further optimized, is solved in that the lighting device comprises: a light-emitting element with a light-emitting face; the light guide having a light entry face, the light guide being configured to guide light emitted by the light-emitting element by means of total internal reflection; and a separator sheet comprising a first face and a second face, wherein the first face is arranged in direct contact to the light entry face, wherein the second face is arranged opposite the light-emitting face, wherein the separator sheet is arranged such that a minimum distance between the light-emitting face and the light entry face is 300 µm or less, and wherein the separator sheet is arranged such that a gap is provided between the light-emitting element and the separator sheet at least in sections. The invention further relates to a method for production of such a lighting device and to an automotive head light comprising an inventive lighting device.

17 Claims, 4 Drawing Sheets

(56) References Cited

OTHER PUBLICATIONS

From the EPO as the ISA, Notification of Transmittal of the International Search Report and the Written Opinion of the International Searching Authority, or the Declaration corresponding to PCT/EP2019/084189, dated Jan. 30, 2020, 12 pages.

* cited by examiner

LIGHTING DEVICE COMPRISING SEPARATOR SHEET

CROSS REFERENCE TO RELATED APPLICATIONS

This application claims priority to European Patent Application No. 18213876.8 filed on Dec. 19, 2018, and titled "LIGHTING DEVICE COMPRISING SEPARATOR SHEET," which is incorporated herein by reference.

FIELD OF THE INVENTION

The present disclosure relates to a lighting device comprising at least one light-emitting element such as a light-emitting diode (LED) and a light guide for guiding light emitted by the light-emitting element.

BACKGROUND OF THE INVENTION

Lighting devices may comprise optical elements such as collimators configured to shape a directed beam of light from the light emitted by a light source. For example, a beam with specific dimensions and intensity distribution may be obtained from the light emitted by a light source by means of a collimator. Collimators are in particular useful for light-emitting elements such as LEDs that have a relatively broad angular distribution of emission, e.g. a Lambertian distribution of emission.

Optical elements may be configured as light guides. Light may be coupled into an entry face of the light guide, and for instance a collimation is effected inter alia based on a total internal reflection of light at side surfaces of the light guide. The effectivity of the lighting device crucially depends on the amount of light that is coupled into the entry face of the light guide. Hence, it is typically desirable to arrange the light-emitting element and the light guide as close to each other as possible to maximize the amount of light coupled into the light entry face.

In addition, the effectivity of the light guide is further dependent on the rate of total internal reflection and therefore on the angular distribution of the light entering the light guide. Light-emitting elements typically comprise ceramic light-emitting surfaces and transparent materials with high refractive indices such as silicone are used for the light guide. A direct optical contact between a light-emitting face of the light-emitting element and the light entry face of the light guide is to be avoided. Rather, an air gap is typically left between the light-emitting face and the light entry face, as the light is refracted at the interfaces between the light-emitting face and the air and between the air and the light entry face such that a larger amount of light may be subject to total internal reflection. A direct optical contact, on the contrary, would lead to a comparably unfavorable refraction of light at the interface of light-emitting face and light entry face and to a significant loss in intensity in the collimated light. In addition, blue light will be extracted more efficiently from the light emitting element compared to converted yellow light, which will lead to a color shift of the collimated light, in particular when thermal stresses occur.

Therefore, light-emitting element and light guide are usually arranged with a considerably large air gap between light-emitting face and light entry face to avoid such an optical contact. The distance between the light-emitting face and the light entry face is typically chosen with regard to the thermal expansion of the light guide and the production tolerances, which reduces the amount of light that is coupled into the light entry face.

Hence, lighting devices comprising light guides as collimators still require further optimization regarding the amount of light being coupled into the light guide and the effectivity of collimation.

SUMMARY OF THE INVENTION

It is an object of the present invention to provide a lighting device comprising a light guide, wherein the amount of guided light is further optimized. The invention further relates to a method for production of a lighting device and to an automotive head light comprising an inventive lighting device (22).

According to a first aspect of the present invention, a lighting device is provided, comprising: at least one light-emitting element with a light-emitting face; a light guide with a light entry face, the light guide being configured to guide light emitted by the light-emitting element by means of total internal reflection; and a separator sheet comprising a first face and a second face, wherein the first face is arranged in direct contact to the light entry face, wherein the second face is arranged opposite the light-emitting face, and wherein the separator sheet is arranged such that a minimum distance between the light-emitting face and the light entry face is 300 µm or less.

According to a second aspect of the present invention, a method for production of a lighting device is provided, the method comprising: providing at least one light-emitting element with a light-emitting face; providing a light guide with a light entry face, the light guide being configured to guide light emitted by the light-emitting element by means of internal reflection; providing a separator sheet comprising a first face and a second face; arranging the first face into direct contact to the light entry face; and arranging the second face opposite the light-emitting face such that a minimum distance between the light-emitting face and the light entry face is 300 µm or less.

According to a third aspect of the present invention, an automotive head light comprising an inventive lighting device is provided.

Exemplary embodiments of the first, second, and third aspect of the invention have or may have one or more of the following properties as described below.

The at least one light-emitting element has a light-emitting face, which is for instance a face of the light-emitting element that may provide the highest intensity of emitted light. In particular, the light-emitting element may have a substantially planar shape, wherein one of the main faces of the planar shape is configured as light-emitting face. In some embodiments, the light-emitting element may be based on semi-conducting elements. The light-emitting element may in particular have a light-emitting face comprising or consisting of (semi-transparent or transparent) ceramic material, in particular a ceramic material based on aluminium oxide and/or a wavelength conversion layer.

The light guide is configured to guide light emitted by the light-emitting element by means of total internal reflection and comprises or consists of transparent material. The light guide may have side faces that are shaped for guiding light, such that light undergoing a total internal reflection at the side faces is redirected towards a light exit face of the light guide with a given beam shape and intensity distribution. The shape of the light entry face may be conformed to the shape of the light-emitting face of the light-emitting element. In particular, the light entry face may have a planar and/or rectangular shape corresponding to the shape of the light-emitting face. In some embodiments, the light guide has an expanding shape in that the cross section of the light guide is continuously enlarged from the light entry face to the light exit face. The shape of the light exit face of the light guide may deviate in shape and/or aspect ratio from the light entry face.

According to the invention, a minimum distance between the light-emitting face and the light entry face of 300 µm or less is provided. The minimum distance between the light-emitting face and the light entry face may in particular be less than the minimum distance that is typically required to avoid optical contact due to thermal expansion and due to production tolerances, significantly enhancing the amount of light that is coupled into the light entry surface. At the same time, a direct optical and mechanical contact between the light-emitting face and the light entry face is avoided. A separator sheet comprising a first face and a second face is provided, wherein the first face is arranged in direct contact to the light entry face, and wherein the second face is arranged opposite the light-emitting face. That is, the separator sheet is disposed in between the light-emitting element and the light guide.

The first face of the separator sheet may be in direct mechanical and in particular direct optical contact to the light entry face. Thus, the separator sheet may serve as a mechanical barrier for the position of the light guide. An optical contact of the light-emitting element and the light guide due to thermal expansion or tolerances in the arrangement and the size of the light guide is therefore avoided, as the separator sheet may ensure that a minimum distance between light-emitting element and light guide is maintained. The separator sheet according to the invention also provides for a gap between the light-emitting element and the separator sheet at least in sections, such that a refraction effect being advantageous for total internal reflection in the light guide takes place. The gap may for example be filled with air that has a refractive index being lower than the refractive index of the light-emitting face and the light guide.

Hence, with the lighting device of the present invention, light-emitting element and light guide may be positioned very close to each other to optimize the amount of light coupled into the light-emitting face, while at the same time an optical contact between the light-emitting element and the light guide is avoided, optimizing the total internal reflection in the light guide.

According to an exemplary embodiment of the invention, the light guide is configured to collimate light emitted by the light-emitting element by means of total internal reflection. That is, the light guide is configured as collimator for the light emitted by the light-emitting element.

As the separator sheet ensures that the light-emitting element and the light guide are not in optical contact with each other, the minimum distance may be reduced further. According to an exemplary embodiment of the invention, the separator sheet is arranged such that the minimum distance between the light-emitting face and the light entry face is 150 µm or less. As the amount of incoupled light is typically increased with a smaller distance between the light-emitting face and the light entry face, the effectivity of the lighting device is improved further. In some embodiments, the minimum distance between the light-emitting face and the light entry face is 50 µm or less, resulting in a particularly high efficiency.

According to another exemplary embodiment of the invention, the separator sheet has a thickness from the first face to the second face of 50 µm or less. As the separator sheet is positioned in between the light-emitting element and the light guide, a smaller thickness of the separator sheet may provide for an arrangement with a smaller minimum distance and therefore improved incoupling of light. In particular, a thickness of 30 µm or less may be provided. In some embodiments, the thickness of the separator sheet may be chosen significantly lower, wherein the minimum thickness of the separator sheet may be only restricted by mechanical considerations, i.e. the stability of the separator sheet in view of the thermal expansion of the other elements of the lighting device. A minimum thickness of the separator sheet from the first face to the second face may be 3 µm, in particular 10 µm.

According to another exemplary embodiment of the invention, at least one spacer element is provided, the at least one spacer element being configured to arrange the second face at a predetermined minimum distance to the light-emitting face. The predetermined minimum distance between the second face and the light-emitting element represents the minimum thickness of the gap that provides the aforementioned advantageous refraction effect, wherein the gap may for instance be filled with air. The spacer element may therefore be configured such that direct mechanical or optical contact between the light-emitting face and the second face of the separator sheet is avoided. In some embodiments, the spacer element may be arranged between the light-emitting face and the second face of the separator sheet. Alternatively, to avoid light being blocked and/or refracted by the spacer element, the spacer element may be arranged spaced apart from the light-emitting face. In particular, the light-emitting element may comprise a substrate such a heat sink and/or a circuit board. The spacer element may be arranged in between the substrate and the separator sheet.

According to an alternative exemplary embodiment of the invention, the second face is arranged in direct mechanical contact to the light-emitting face. In this embodiment, the minimum distance between the light-emitting face and the light entry face may substantially be equal to the thickness of the separator sheet. The direct contact is provided in regions of the light-emitting face, such that the remaining regions of the light-emitting face provide a gap between the light-emitting face and the second face. In an embodiment, the light-emitting face and the second face have a substantially planar shape that is in direct contact to each other. While having a substantially planar shape, the light-emitting face and second face may have surface irregularities that effectively produce gaps in form of cavities between the light-emitting face and the second face in regions, which gaps provide an advantageous refraction of light. The separator sheet and/or the light-emitting face may have a surface hardness that is sufficient to retain the cavities even when a contact pressure is increased, e.g. due to thermal stresses during operation of the lighting device.

According to another exemplary embodiment of the invention, a surface roughness Rz of the second face is less than 1 µm, in particular less than 100 nm or less than 10 nm. Typically, the surface roughness Rz of the light-emitting face, in particular of a light-emitting face comprising ceramics, may be in the order of micrometers, e.g. around 1 µm. Thus, when the surface roughness Rz of the second face is relatively small, also with a direct mechanical contact between the second face and the light-emitting face, regions with gaps between the second face and light-emitting face may be obtained. A full optical contact over the whole light-emitting face may therefore be avoided.

The separator sheet may comprise or consist of a transparent material, e.g. a material with a transmissivity of 90% or more for the light emitted by the light-emitting element. The material of the separator sheet may be chosen such that the separator sheet is able to withstand the mechanical stress that may in particular be caused by the direct contact to the light entry face and optionally the light-emitting face. For some applications, it is further desirable that the material of the separator sheet has a high thermal stability, such that a small predetermined distance to the light-emitting face or even a direct contact to the light-emitting face may be provided. According to an exemplary embodiment of the invention, the separator sheet comprises or consists of glass. Glass may combine one or more of the aforementioned advantages and may in particular be heat resistant up to temperatures that occur when operating light-emitting elements such as LEDs. In particular, glass may also be shaped into sheets with a small thickness while providing good mechanical stability and high transmissivity. Glass may also provide a hardness that is sufficient to prevent a deformation of the second face when the second face is brought into direct mechanical contact to the light-emitting face. A closing of gaps that are present due to the surface roughness of the light-emitting face can therefore be avoided, for instance even when thermal stresses press the second face onto the light-emitting face.

The light guide comprises or consists of transparent material, preferably a transparent material with a high refractive index. In principle, any kind of plastics material and in particular material based on polycarbonates may be used. According to another exemplary embodiment of the invention, the light guide comprises or consists of silicone. Transparent silicone has in particular a comparably high refractive index and is simple to manufacture, wherein the light guide can be produced with different shapes. Further, silicone may have elastic properties such that the light guide may be deformable.

According to another exemplary embodiment of the invention, the light guide and the separator sheet are arranged such that the first face is pressed onto the light entry face. This arrangement may in particular be advantageous when the light guide comprises an elastic material such as silicone. In the prior art relating to lighting devices without the inventive separator sheet, an elastic material for the light guide may be problematic, as the material of the light entry face may be pressed onto the light-emitting face due to thermal expansion. The remaining gaps between the light entry face and the light-emitting face are then closed and effectivity of the lighting device is reduced. With the present invention, pressing the first face onto the light entry face may be even advantageous, as the first face serves as a mechanical boundary to the light guide, leading to a well-defined arrangement of the light entry face. With the separator sheet, a direct (optical) contact between the light entry face and the light-emitting face is avoided.

According to another exemplary embodiment of the invention, the lighting device further comprises secondary optics, for instance at least one reflecting element and/or at least one refractive element and/or at least one diffusing element and/or at least one filter. For some applications, the secondary optics may comprise a reflector cup and/or a lens system. The light guide may be configured to collimate the light emitted by the light-emitting element towards the secondary optics. The secondary optics may also comprise a collimator, wherein the light guide is configured as a pre-collimator for the collimator.

According to another exemplary embodiment of the invention, the light-emitting element comprises at least one LED. For instance, an LED may comprise at least one semiconductor element such as a p-n-junction, a diode, and/or a transistor. For instance, LEDs may be provided in form of separate or combined LED dies and/or LED packages. At least one LED may be arranged on a substrate, e.g. a heat sink, an interposer and in particular a (printed) circuit board. An LED package may comprise a wavelength conversion element (e.g. based on phosphor) and/or may comprise at least one optical element such as a reflective element (e.g. a reflector cup). The LED may for instance be mounted onto an LED lead frame.

In another exemplary embodiment according to the invention, the lighting device is configured for automotive lighting, in particular for automotive head lighting. Automotive lighting devices and in particular automotive head lights may require high light intensities, such that multiple light-emitting elements may be coupled into secondary optics by means of light guides acting e.g. as collimators. As described above, the lighting device according to the invention provides for high efficiency of the light incoupling and the collimation, while allowing for a stable mechanical arrangement of the light-emitting elements and the light guides.

The features and example embodiments of the invention described above may equally pertain to the different aspects according to the present invention. In particular, with the disclosure of features relating to the lighting device according to the first aspect, also corresponding features relating to the method according to the second aspect and the automotive head light according to the third aspect are disclosed.

It is to be understood that the presentation of embodiments of the invention in this region is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE DRAWINGS

Examples of the invention will now be described in detail with reference to the accompanying drawing, in which.

DETAILED DESCRIPTION OF THE EMBODIMENTS

Figure 1:
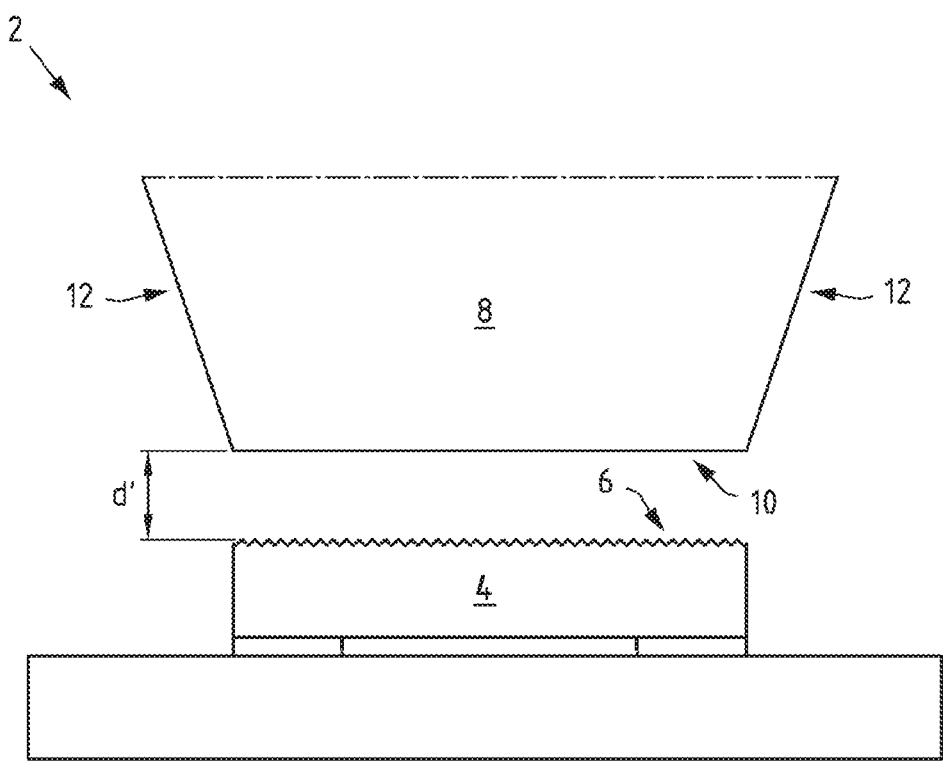
FIG. 1 shows a schematic representation of a lighting device according to the prior art.

FIG. 1 shows a schematic representation of a lighting device 2 according to the prior art in a side view. The lighting device 2 comprises a light-emitting element 4 with a light-emitting face 6 and a light guide 8 with a light entry face 10.

A minimum distance d' between the light-emitting face 6 and the light entry face 10 is maintained to optimize the amount of light that is subject to total internal reflection on side faces 12 of the light guide 8. An air gap is formed as a result of the minimum distance d', and light is refracted at the interfaces of the air gap to the light-emitting face 6 and to the light entry face 10. In case a direct optical contact would be provided between the light-emitting face 6 and the light entry face 10, a comparably unfavorable refraction of light would occur at the interface of light-emitting face 6 and light entry face 10, resulting in a significant loss in intensity of the collimated light. Therefore, a relatively large minimum distance d' is provided to ensure that a direct contact is avoided, wherein the thermal expansion and production tolerances are taken into consideration.

However, the relatively large minimum distance d' in such an arrangement leads to a loss of intensity of light coupled into the light entry surface 10, as the light emitted by the light-emitting element 4 may be rather undirected and for instance of Lambertian type.

Figure 2:
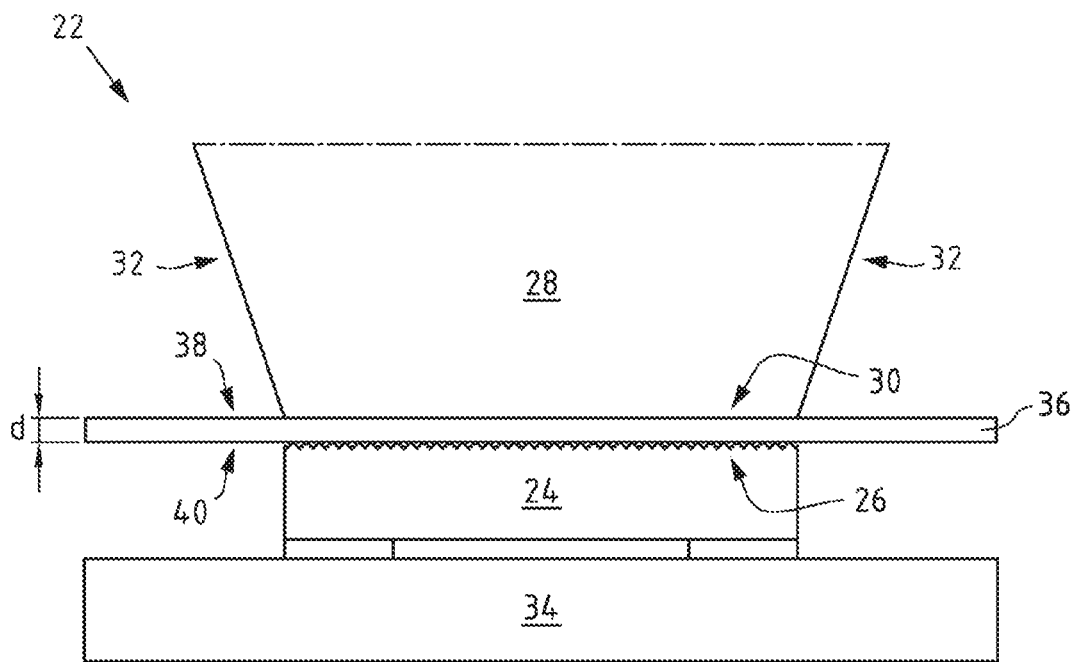
FIG. 2 shows a schematic representation of a first embodiment of a lighting device according to the invention.

FIG. 2 shows a schematic representation of a first embodiment of a lighting device 22 in a side view. The lighting device 22 comprises a light-emitting element 24 with a light-emitting face 26. Further, a light guide 28 with a light entry face 30 is provided, the light guide 28 being configured to collimate light emitted by the light-emitting element 24 by means of total internal reflection at the side faces 32. The light-emitting element 24 is configured as LED arranged on a printed circuit board 34. The light guide 28 consists of transparent silicone. The lighting device 22 is configured as automotive head light, with the light guide 28 being configured as collimator for secondary optics (not shown).

A separator sheet 36 comprising a first face 38 and a second face 40 is provided, wherein the first face 38 is arranged in direct contact to the light entry face 30. The second face 40 is arranged opposite the light-emitting face 26. The separator sheet 36 is arranged such that a minimum distance d between the light-emitting face and the light entry face is 300 µm or less.

In the first embodiment depicted in FIG. 2, the second face 40 is arranged in direct contact to the light-emitting face 26. That is, the second face 40 touches the light-emitting face 26 at certain points or regions, while regions of the light-emitting face 26 are still spaced apart from the second face 40 due to surface irregularities of the light-emitting face 26, as is schematically indicated in FIG. 2. The separator sheet 36 consists of glass and has for example a surface roughness Rz in the order of 1-5 nm, while the light-emitting face 26 of the light-emitting element 24 comprises ceramic material with a surface roughness Rz of about 1 µm. Hence, although there is a direct contact between the second face 40 and the light-emitting face 26, an air gap is still formed at least in regions between the second face 40 and the light-emitting face 26, as cavities are formed due to the surface roughness of the light-emitting face 26 and the rigid properties and the hardness of the separator sheet 36. With the cavities, a substantial amount of light emitted by the light-emitting element 24 is refracted into the light entry face 30 with an angle that is suitable for total internal reflection.

In contrast, in case a direct contact between the light-emitting face 26 and the light entry face 30 would be made (i.e. the separator sheet 36 would be omitted), the elastic properties of the silicone of the light guide 28 would lead to an effective closing of the cavities, as the light guide 28 would conform to the surface irregularities of the light-emitting face 26.

According to the invention, the minimum distance d can be reduced significantly to optimize the amount of light coupled into the light entry face 30. In the first embodiment, the minimum distance d may be substantially equal to the thickness of the separator sheet 36 from the first face 38 to the second face 40, which may be less than 50 µm or less than 30 µm.

Figure 3:
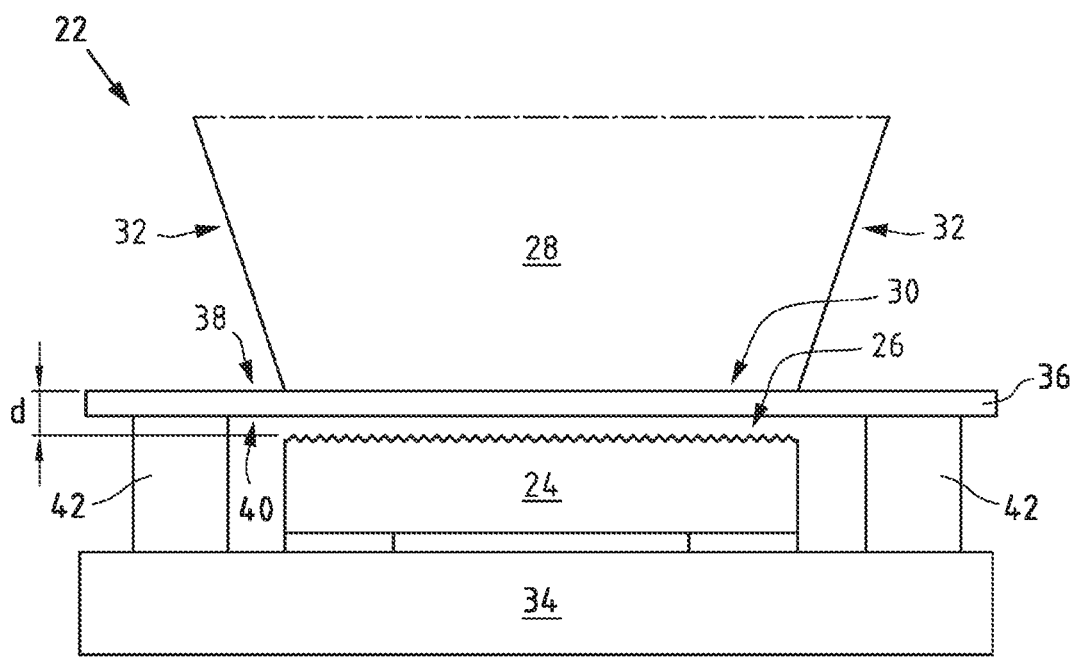
FIG. 3 shows a schematic representation of a second embodiment of a lighting device according to the invention.

FIG. 3 shows a schematic representation of a second embodiment of a lighting device 22 according to the invention. The same reference numerals as in FIG. 2 have been used for corresponding elements.

The arrangement of the lighting device 22 in FIG. 3 differs from the arrangement of FIG. 2 in that the light-emitting face 26 is not in direct contact to the second face 40 and spacer elements 42 are provided. The spacer elements 42 are configured to arrange the second face 40 at a predetermined minimum distance to the light-emitting face 26. The minimum distance d is therefore substantially equal to a sum of the thickness of the separator sheet 36 and said predetermined minimum distance. The spacer elements 42 are arranged in between the separator sheet 36 and the printed circuit board 34 of the light-emitting element 24.

The second embodiment may be particularly advantageous for configurations with a light-emitting face 26 and/or a second face 40 having a small surface roughness Rz. By providing the predetermined minimum distance, a gap to the second face 40 over the entire light-emitting face 26 may be obtained, further improving the effectivity of the collimation.

Figure 4:
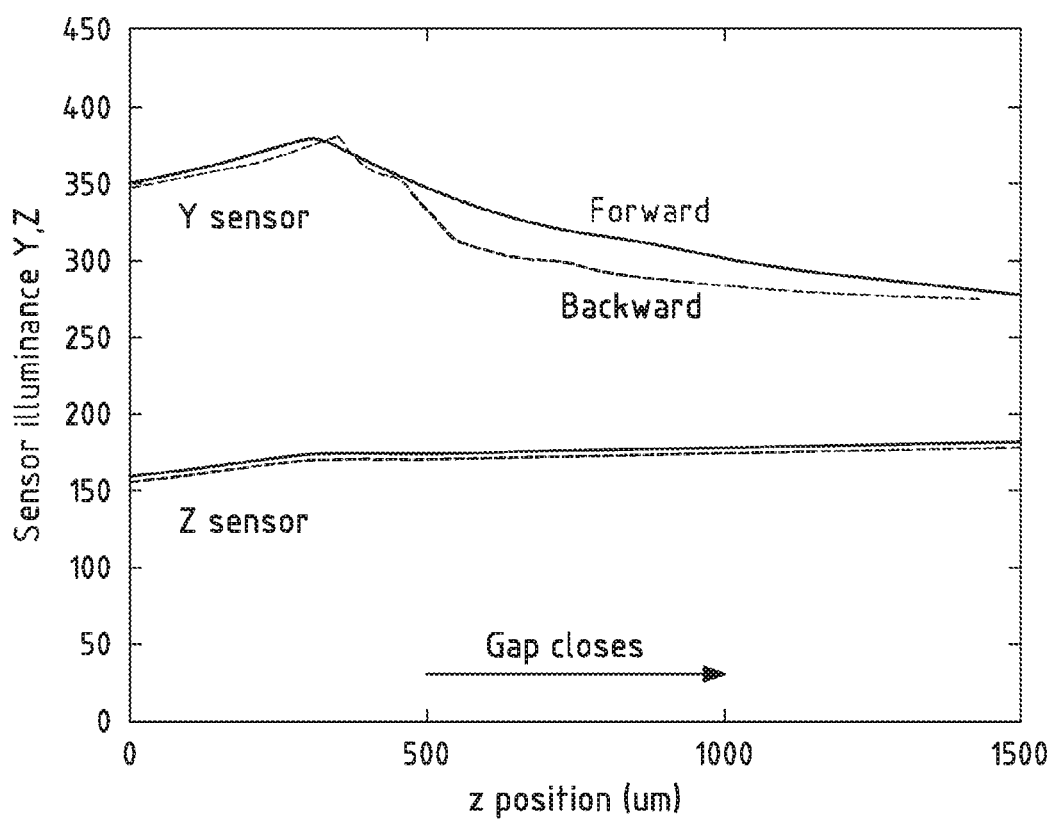
FIG. 4 shows a schematic diagram of the illuminance of a lighting device according to the prior art in dependence of the relative position of light guide and light-emitting element.
Figure 5:
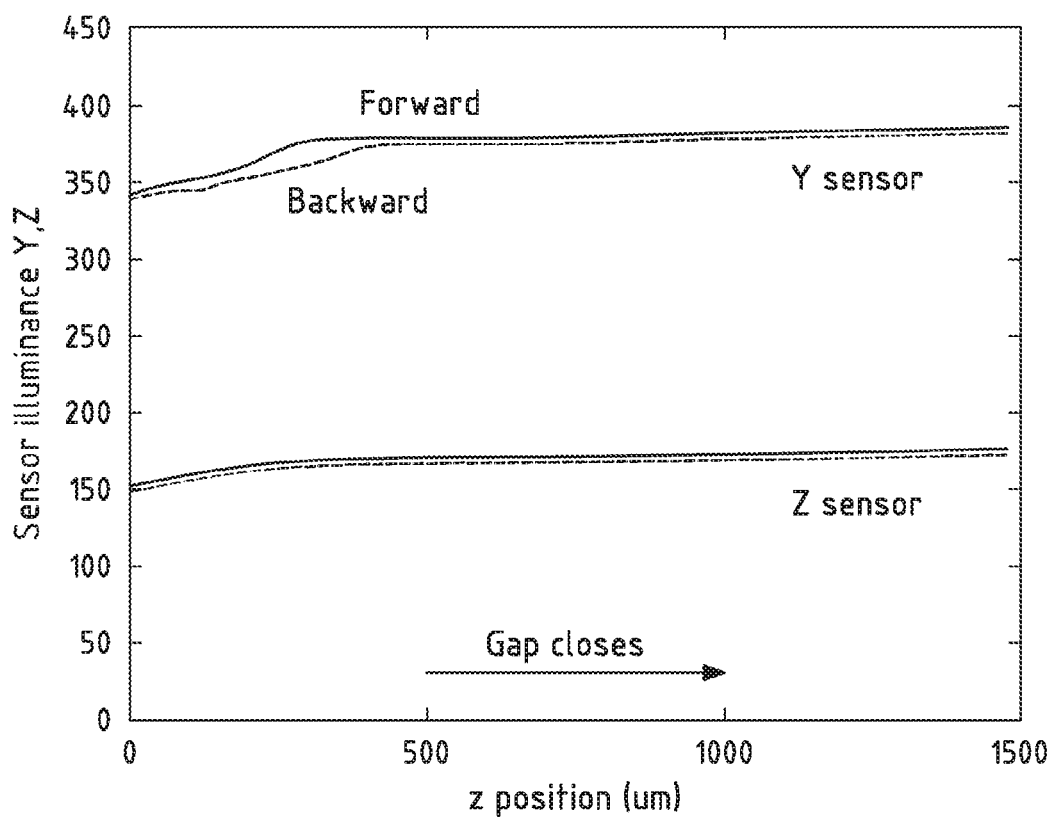
FIG. 5 shows a schematic diagram of the illuminance of a lighting device according to the invention in dependence of the relative position of light guide and light-emitting element.

FIGS. 4 and 5 show schematic diagrams of the illuminance of lighting devices according to the prior art and according to the invention based on experiments. FIG. 4 shows the illuminance in dependence of the relative position of light guide and light-emitting element for a lighting device of the prior art, i.e. without a separator sheet. The illuminance that is detected at the light exit face of the collimator is depicted for different color sensors Y and Z at the ordinate. The abscissa is represented by the position of the light exit surface of the light guide, wherein higher values correspond to the light guide being positioned closer to the light-emitting element, i.e. in a direction in which a gap between light-emitting face and light entry face closes. The sensor illuminance has been measured for a forward motion of the light guide (towards higher position values) and for a backward motion of the light guide (towards lower positon values).

Starting from the left hand side in FIG. 4, it can be seen that reducing the gap increases the sensor illuminance at the beginning, as the amount of light coupled into the light guide is enhanced. Then, a maximum in intensity is observed at a position of about 350 µm, approximately when mechanical contact is made between the light-emitting face and the light entry face.

When the light guide is moved further, the light entry face is pressed into the light-emitting face, effectively leading to a direct optical contact. Remaining cavities are closed due to the elastic properties of the light guide. In this region, it can be seen that the illuminance diminishes at least for color sensor Y. In addition, a color shift occurs in that the illuminances of color sensors Y and Z (measuring different colors) behave differently with variations of the position.

FIG. 5 shows a schematic diagram of the illuminance of a lighting device according to the invention in dependence of the relative position of light guide and light-emitting element. A separator sheet made of glass with a thickness of 30 µm has been used. As in FIG. 4, the illuminance being detected at the light exit face of the collimator is shown for different color sensors Y and Z at the ordinate, while the abscissa is represented by the position of the light exit surface of the light guide. Higher values in position correspond to the light guide being brought closer to the light-emitting element.

Starting from the left hand side in FIG. 5, the illuminance also increases due to the smaller distance between light-emitting face and light entry face. A direct contact is made between the second face and the light-emitting face at a position of about 350 µm. Due to the separator sheet, a direct optical contact between light-emitting face and light entry face is avoided at least in regions. With higher position values, the light exit surface is moved further in direction of the light-emitting element, the light guide being pressed further onto the separator sheet. Contrary to the behavior of the illuminance shown in FIG. 4, the sensor illuminance is not reduced with higher position values. Further, a color shift is also substantially avoided, as the difference of illuminance of the color sensors Y and Z is approximately constant with variations of the position.

LIST OF REFERENCE SIGNS 2, 22 lighting device
4, 24 light-emitting element
6, 26 light-emitting face
8, 28 light guide
10, 30 light entry face
12, 32 side faces
34 printed circuit board
36 separator sheet
38 first face
40 second face
42 spacer element
d, d' minimum distance

The invention claimed is:

1. A lighting device, comprising:
a light-emitting element with a light-emitting face;
a light guide with a light entry face, the light guide being configured to guide light emitted by the light-emitting element by means of total internal reflection; and
a separator sheet comprising a first face and a second face, the first face arranged in direct contact to the light entry face and the second face arranged opposite the light-emitting face, the separator sheet arranged such that a minimum distance between the light-emitting face and the light entry face is 300 µm or less, and the separator sheet arranged such that a gap is provided in at least a portion of a region that is between the light-emitting element and the separator sheet.

2. The lighting device according to claim 1,
wherein the light guide is configured to collimate light emitted by the light-emitting element by means of total internal reflection.

3. The lighting device according to claim 1,
wherein the separator sheet is arranged such that the minimum distance between the light-emitting face and the light entry face is 150 µm or less.

4. The lighting device according to claim 1,
wherein the separator sheet has a thickness from the first face to the second face of 50 µm or less.

5. The lighting device according to claim 1,
wherein at least one spacer element is provided, the at least one spacer element being configured to arrange the second face at a predetermined minimum distance to the light-emitting face.

6. The lighting device according to claim 1,
wherein the second face is arranged in direct mechanical contact to the light-emitting face.

7. The lighting device according to claim 1,
wherein the separator sheet comprises or consists of glass.

8. The lighting device according to claim 1,
wherein the light guide comprises or consists of transparent silicone.

9. The lighting device according to claim 1,
wherein the light guide and the separator sheet are arranged such that the first face is pressed onto the light entry face.

10. The lighting device according to claim 1,
further comprising secondary optics, wherein the light guide is configured to guide the light emitted by the light-emitting element towards the secondary optics.

11. The lighting device according to claim 1,
wherein the light-emitting element comprises at least one light-emitting diode.

12. A method for production of a lighting device, the method comprising:
providing a light-emitting element with a light-emitting face;
providing a light guide with a light entry face, the light guide being configured to guide light emitted by the light-emitting element by means of total internal reflection;
providing a separator sheet comprising a first face and a second face;
arranging the first face into direct contact to the light entry face;
arranging the second face opposite the light-emitting face such that a minimum distance between the light-emitting face and the light entry face is 300 µm or less; and
arranging the separator sheet such that a gap is provided between the light-emitting element and the separator sheet at least in sections.

13. An automotive head light comprising the lighting device according to claim 1.

14. The lighting device according to claim 1, wherein the second face has a lesser surface roughness less than 1 µm, and the light-emitting face has a greater surface roughness than the second face.

15. The lighting device according to claim 14, wherein the greater surface roughness is 1 µm, and the lesser surface roughness is less than 100 nm.

16. The lighting device according to claim 1, wherein the separator sheet comprises a material with a transmissivity of 90% or greater to light emitted by the light-emitting element.

17. The lighting device according to claim 5, wherein the at least one spacer element is not in direct contact with the light-emitting face.

* * * * *